United States Patent [19]

Cuppens

[11] Patent Number: 5,424,976
[45] Date of Patent: Jun. 13, 1995

[54] PROCESSING SYSTEM WITH A FERROELECTRIC MEMORY

[75] Inventor: Roger Cuppens, Eindhoven, Netherlands

[73] Assignee: U.S. Philips Corporation, New York, N.Y.

[21] Appl. No.: 179,802

[22] Filed: Jan. 11, 1994

[30] Foreign Application Priority Data

Jan. 12, 1993 [EP] European Pat. Off. ............ 93200068

[51] Int. Cl.[6] ........................................... G11C 11/22
[52] U.S. Cl. ................................. 365/145; 365/149; 365/220; 365/238.5
[58] Field of Search ............. 365/145, 149, 220, 238.5

[56] References Cited

U.S. PATENT DOCUMENTS

| | | | |
|---|---|---|---|
| 4,593,382 | 6/1986 | Fujishima et al. | 365/149 |
| 4,599,709 | 7/1986 | Clemons | 365/238.5 |
| 4,873,664 | 10/1989 | Eaton, Jr. | 365/145 |
| 4,888,733 | 12/1989 | Mobley | 365/149 |

FOREIGN PATENT DOCUMENTS

0359404  3/1990  European Pat. Off. ..... G11C 11/22

*Primary Examiner*—Joseph A. Popek
*Assistant Examiner*—F. Niranjan
*Attorney, Agent, or Firm*—Steven R. Biren

[57] ABSTRACT

A word oriented processing system includes a processing unit and a ferroelectric memory having a plurality of memory units organized in a matrix of rows and columns. Each memory unit stores a processor dataword of, for example, 8 or 16 bits, and contains a plurality of serial arrangements of, successively, a bitline connection, a first switching element, a ferroelectric capacitor and a node. The serial arrangements have the node in common. The node is connected to a plateline connection of the unit via second switching element. The processor reads or writes all bits of a word from one memory unit at a time. During reading or writing in one memory unit the first and second switching elements isolate the capacitors in other memory units from pulses on any of their plates.

20 Claims, 4 Drawing Sheets

PROCESSING SYSTEM WITH A FERROELECTRIC MEMORY

BACKGROUND OF THE INVENTION

This invention relates to a word oriented processing system. Such a system contains a processing unit and a memory. The invention also relates to a ferroelectric memory device suitable for use in such a processing system.

From European patent application No EP-A 0359404 which corresponds to U.S. Pat. No. 4,888,733 (Dec. 19, 1989), a ferroelectric memory is known which contains ferroelectric capacitors containing ferroelectric material between their plates. A bit of information is represented in this ferroelectric memory as an amount of remanent polarization of the ferroelectric material. Reading and writing of such a bit involves supplying a voltage pulse across the plates of the capacitor. This pulse is supplied to the memory via a bitline connection and a plateline connection.

The known memory comprises memory units organized in rows and columns. The units in a column are connected in common to a bitline and a plateline. In order to access only the capacitor in one of these units at a time, the known memory provides for a row select line. By using this row select line, access may be restricted to a unit from one row at a time by the selective activation of first and second switching elements in the units in one row.

The abovementioned publication teaches the use of two switching elements in a unit, connected respectively between the bitline and a first plate of the capacitor and the plateline and a second plate of the capacitor. The use of two switching elements prevents both that a pulse current occurs via the ferroelectric capacitor when the unit is not selected, and also that a pulse voltage is supplied to either plate of the ferroelectric capacitor; no matter whether such a pulse occurs on the plateline connection or on the bitline connection of the unit.

This substantially prevents parasitic disturbance of the polarization on the capacitors in unselected units. However, the prior art memory has the disadvantage that it achieves this effect by using twice as many switching elements as there are capacitors, which constitutes a large amount of overhead for a memory circuit.

SUMMARY OF THE INVENTION

Amongst others, it is an object of the invention to provide a word oriented processing system with a ferroelectric memory in which pulses across the plates of ferroelectric capacitors in unselected units are substantially prevented, without requiring two switching elements per capacitor.

It is a further object of the invention to increase the average speed of access to the capacitors.

The invention provides for a word oriented processing system, comprising a processing unit interfaced to a ferroelectric memory which is organized in a matrix of rows and columns of identical memory units, each column comprising a respective plateline for conducting an access pulse, each memory unit comprising a series arrangement connected between a bitline connection and the plateline of the column to which the unit belongs, the series arrangement comprising successively the bit line connection, a first switching element, a ferroelectric capacitor and a second switching element, the memory comprising means for activating the first and second switching elements of memory units selected by the processor unit for establishing a charge transfer path through the memory unit, wherein each memory unit comprises a plurality of said series arrangements, which share the second switching element, the system comprising access means arranged for writing and/or reading respective information bits of a word as polarization of the respective ferroelectric capacitors in the respective series arrangements in a memory unit which is selected by the processor and for collectively transferring the information bits of said word in parallel between said memory unit and the processing unit. Each unit which stores an N bit word needs only N+1 switching elements. Typical word sizes are in the processing unit are a small multiple of eight bits, for example, N=8, 16 or 32. Therefore, the number of serial arrangements in each unit in the system according to the invention is preferably the same multiple of eight. In this way the various bits of a word are concentrated in a single memory unit and not distributed over different memory matrices (which could possibly even require different integrated circuits).

In an embodiment of the word oriented processing system according to the invention the processing unit is coupled to an enable input and an address input of the access means for sending an access enable signal in combination with an address of a particular column, the access means being arranged for supplying an access pulse on the plateline of the particular column only upon reception of said access enable signal. Thus, a plurality of capacitors from an individual unit can be accessed simultaneously using a single plateline which is designated with the address. Only one drive circuit for selectively supplying the access pulse to this single plateline in response to the access enable signal needs to be provided to access a plurality of capacitors per column.

In a further embodiment of the word oriented processing system according to the invention each column comprises an identical set of bitlines that are connected on a one to one basis to the bitline connections of each memory unit in the column, each bitline being connected to a respective dataline switching element, the dataline switching elements in each column being coupled on a one to one basis to a set of data input/output lines common to all columns, the access means being arranged for collectively activating only the dataline switching elements of the accessed column during said access pulse. The data lines and the data line switching elements provide for simultaneous access to the plurality of capacitors.

An embodiment or the word oriented processing system according to the invention comprises equalizing means under control of the access means arranged for mutually equalizing the voltage levels of the respective plateline and the bitlines in each respective column other than the accessed column during said access pulse comprises equalizing means under control of the access means, arranged for mutually equalizing the voltage levels of the respective plateline and the plurality of bitlines in each respective column other than the particular column during said access pulse. A whole row of units has its capacitors connected to its respective platelines and bitlines at a time. By equalizing the unaccessed columns, the disturbance of the polarization on the capacitors in unselected columns due to parasitic coupling is reduced further.

In an embodiment of the word oriented processing system according to the invention the equalizing means in each column comprise equalizing switching elements, coupled between on the one hand a reference voltage node and on the other hand the plateline and the bitlines respectively, the access means being arranged for activating the equalizing switching elements in a column when the dataline switching elements in that column are deactivated. The reference voltage node may, for example, be at ground potential; with a single control signal the access means can thus control both the equalizing and dataline connection.

In an embodiment of the word oriented processing system according to the invention the equalizing means are arranged for mutually equalizing the voltage levels of the respective plateline and the plurality of bitlines in all respective columns between successive access pulses, prior to activations of the switching elements in a row. In this way, any charge remaining on the bitlines and plateline after access cannot disturb the unit in a newly selected row.

It should be noted that from U.S. Pat. No. 4,873,664 a ferroelectric memory is known with two ferroelectric capacitors per memory unit. In contrast to the present invention, these two capacitors are used to store only a single bit differentially in each unit. The access means for this memory are arranged for differential sensing. In contrast to the invention, the access means read only the single bit from the unit. Moreover, all the capacitors of the units in each column of this memory are connected together to a common plateline without the intervention of a second switch.

The present invention also applies to memories in which a multibit word can be read in parallel from pairs of ferroelectric capacitors in the unit by sensing the respective differences in remnant polarizations in capacitors of respective pairs.

BRIEF DESCRIPTION OF THE DRAWINGS

The word oriented processing system according to the invention and its advantageous aspects will be further described in connection with the accompanying drawing in which.

DESCRIPTION OF THE PREFERRED EMBODIMENTS

Figure 1A:
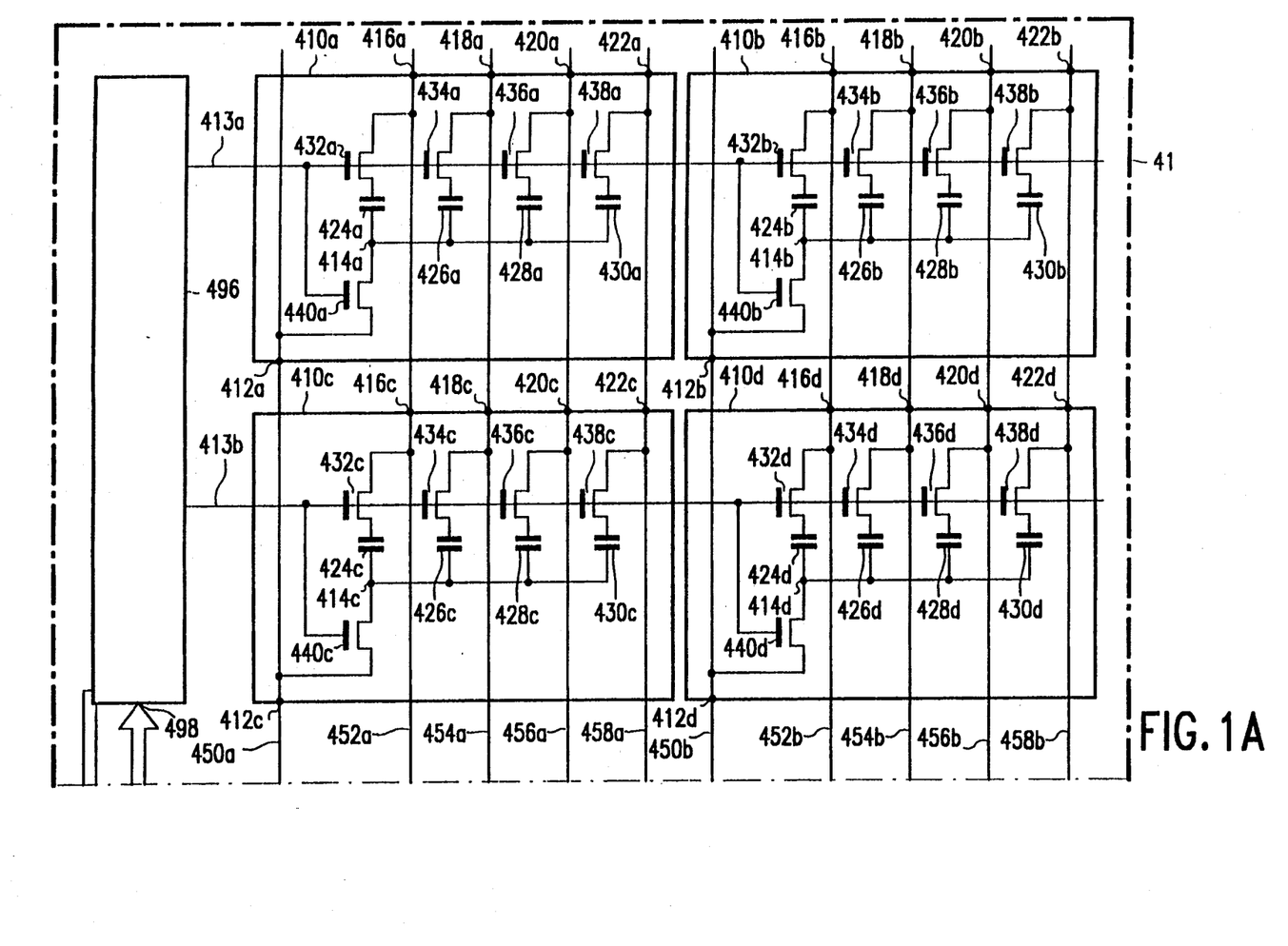
FIGS. 1A, 1B shows an embodiment of a word oriented processing system according to the invention.
Figure 1B:
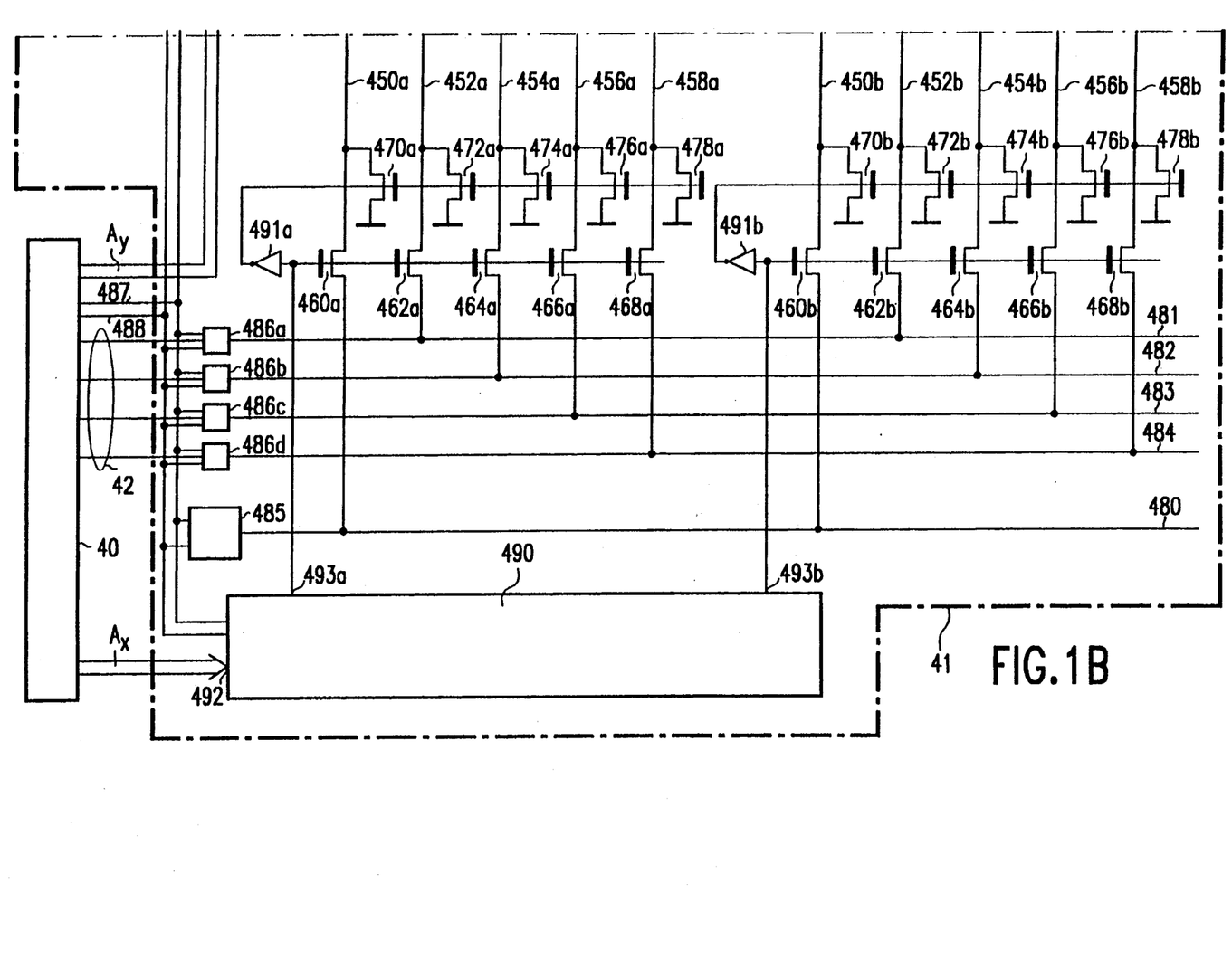

FIG. 1 shows an embodiment of a word oriented signal processing system according to the invention. The system contains a processing unit 40 and a ferroelectric memory 41. The processing unit 40 has an address output Ax, Ay, a data input/output 42 and control outputs coupled to read and write signal lines 487, 488.

The ferroelectric memory 41 contains a number of units 410a, 410b, 410c, 410d, organized in rows and columns. For each column there is one plateline 450a, 450b and a plurality of bitlines 452a,b, 454a,b, 456a,b, 458a,b. Each unit 410a,b,c,d has a plateline connection 412a,b,c,d and a plurality of bitline connections 416a,b,c,d, 418a,b,c,d, 420a,b,c,d, 422a,b,c,d. The bitline connections in each unit 410a,b,c,d are coupled to a common node 414a,b,c,d, in the unit via a respective serial arrangement of the first bitline connection 416a,b,c,d, 418a,b,c,d, 420a,b,c,d, 422a,b,c,d, a respective first switch 432a,b,c,d, 434a,b,c,d, 436a,b,c,d, 438a,b,c,d, and a respective ferroelectric capacitor 424a,b,c,d, 426a,b,c,d, 428a,b,c,d, 430a,b,c,d. The common node 414a,b,c,d is coupled to the plateline connection 412a,b,c,d via a second switch 440a,b,c,d, which is also a part of the unit 410a,b,c,d.

The first switches 432a,b,c,d, 434a,b,c,d, 436a,b,c,d, 438a,b,c,d and the second switch 440a,b,c,d are implemented using the channel of insulated gate field effect transistors 432a,b,c,d, 434a,b,c,d, 436a,b,c,d, 438a,b,c,d, 440a,b,c,d. The gates of these transistors 432a,b,c,d, 434a,b,c,d, 436a,b,c,d, 438a,b,c,d, 440a,b,c,d are connected to each other and to an activation input of the unit 410a,b,c,d.

The memory contains a row selection circuit 496. The row selection circuit 496 has an address input 498 for receiving a row address. The row select circuit also has a plurality of row line 413a, 413b outputs. Each row line 413a, 413b is connected to the activation inputs of a row (410a, 410b), (410c, 410d) of memory units.

The platelines 450a, 450b of the columns are coupled to a common plateline 480 via respective switches 460a, 460b. The respective bitlines 452a, 454a, 456a, 458a of each column are connected to respective dam lines 481,482,483,484 via respective switches 462a, 462b, 464a, 464b, 466a, 466b, 468a, 468b. The bitlines 452a, 454a, 456a, 458a and the platelines 450a, 450b of each column are coupled to ground via equalizing switches 470a, 472a, 474a, 476a, 478a. The switches 460a, 460b, 462a, 462b, 464a, 464b, 466a, 466b, 468a, 468b, 470a, 472a, 474a, 476a, 478a are implemented as insulated gate field effect transistors.

The memory circuit contains a column select circuit 490 having an input 492 for a column address. The column select circuit 490 has a plurality of column select outputs 493a, 493b coupled to the gates of the transistors 460a, 460b, 462a, 462b, 464a, 464b, 466a, 466b, 468a, 468b coupling the platelines 450a, 450b and the bitlines 452a, 452b, 454a, 454b, 456a, 456b, 458a, 458b to the common plateline 480 and the datalines 481,482,483,484. The column select outputs 493a, 493b are coupled via inverters 491a, 491b to the gates of the transistors 470a, 470b, 472a, 472b, 474a, 474b, 476a, 476b, 478a, 478b coupling the platelines 450a, 450b and the bitlines 452a, 452b, 454a, 454b, 456a, 456b, 458a, 458b to ground.

The common plateline 480 is coupled to a plateline pulse circuit 485. The plateline pulse circuit 485 is connected to the read write signal enable lines 487, 488. The data lines 481,482,483,484 are coupled to respective read/write amplifiers 486a, 486b, 486c, 486d. The read write amplifiers 486a, 486b, 486c, 486d are connected to the read/write signal lines 487, 488.

The processing unit 40 may be, for example, a microprocessor or a digital signal processor. In operation, the processing unit 40 will address information Ax, Ay to the memory and send or receive data as words containing four bits via the data output 42. (The number of four has been chosen for illustration purposes; any number bits may be used to make up a word). The processing unit 40 performs operations on the words, such as, for example, addition. These operations involve all the bits in the words.

To read or write words, a part Ay of the address data is used to control the row selection circuit 496 which, in response, will provide an activation signal on one row line, say 413a, selected from the plurality of row lines 413a, 413b under control from the part Ay of the address received at the address input 498 of the row selection circuit 496. The activation signal will make the first and second switches 432a, 432b, 434a, 434b, 436a, 436b, 438a, 438b, 440a, 440b of the units in one row conductive. The first and second switches 432c, 432d, 434c, 434d, 436c, 436d, 438c, 438d, 440c, 440d of the unaddressed rows will not be conductive. The column selection circuit 490 will make the plateline switch 460a and the bitline switches 462a, 464a, 466a, 468a of one column conductive, corresponding to the column address Ax received from the processing unit 40 at the address input 492 of the column selection circuit 490. The plateline switch 460b and the bitline switches 462b, 464b, 466b, 468b of the unaddressed columns will not be conductive. Consequently, there will be a charge transfer path from the plateline pulsing circuit 485 to the read-/write amplifiers 486a, 486b, 486c, 486d via
— the common plateline 480,
— the plateline switching element 460a,
— the plateline 450a for the addressed column,
— the second switch 440a of one unit 410a which is in the addressed row
— the respective ferroelectric capacitors 424a, 426a, 428a, 430a in this unit,
— the respective first switches 432a, 434a, 436a, 438a
— the bitlines 452a, 454a, 456a, 458a of the addressed column,
— the bitline switching elements 462a, 464a, 466a, 468a,
— the dam lines 481,482,483,484.

As an alternative, read/write amplifiers 486a, 486b, 486c, 486d may be provided repeatedly, one set for each column. In this case these read/write amplifiers will be located in place of the bitline switches 462a, 464a, 466a, 468a, i.e. between the bitlines 452a,b 454a,b 456a,b 458a,b and the data lines 480, 481, 482, 483, 484.

Units 410b, 410c, 410d which are either in an unaddressed row 410c, in an unaddressed column 410b, or in both an unaddressed row and column 410d, do not provide such charge transfer paths from the common plateline 480 to the data lines 481, 482, 483, 484.

The operation of the memory unit is based on ferroelectric remanence. Reference is had to U.S. Pat. No. 4,873,664 and its references for a discussion of this effect and for ways of effecting reading and writing information on ferroelectric capacitors. For understanding the system according to the invention it suffices to note the following. A ferroelectric capacitor has two plates with some ferroelectric material therebetween. When there is no voltage across the two plates, the ferroelectric material may have either one of two mutually different polarization states. The corresponding polarization is called the remanent polarization, and is non-zero and usually of opposite sign for the two states. The polarization of the ferroelectric material is counteracted by a charge on the plates of the capacitors and the charge on the plates depends on the state of the ferroelectric material.

The two different states are used to represent a logic high and logic low information bit stored in the capacitor respectively. Writing is effected by applying a voltage pulse across the plates of the ferroelectric capacitor. The polarity of the pulse determines the type of information (logic high or low) written. Reading is also effected by applying a voltage pulse across the plates of the ferroelectric capacitor. In effect this corresponds to writing a predetermined logic level to the capacitor. This involves the transfer of an amount of charge to the plates of the capacitor, the amount depending on whether or not the polarization of the ferroelectric material must be changed. The amount is measured to determine the information previously stored in the capacitor.

Reading destroys the information stored in the capacitor, and may need to be followed by rewriting when the information must be reused. All reading and writing pulses applied to the capacitor result in fatigue. Thus, the amount of remanent polarization that the ferroelectric material can retain, and thereby the noise margin for information storage on the capacitor, decreases with cumulative use.

Writing of independent bits of information in the different series arrangements in one unit is effected for example with a pulse method as will be described by reference to FIG. 2. In this figure, by way of example, logic levels 0,1,0,0 are written into capacitors 424a, 426a, 428a, 430a, respectively.

Figure 2:
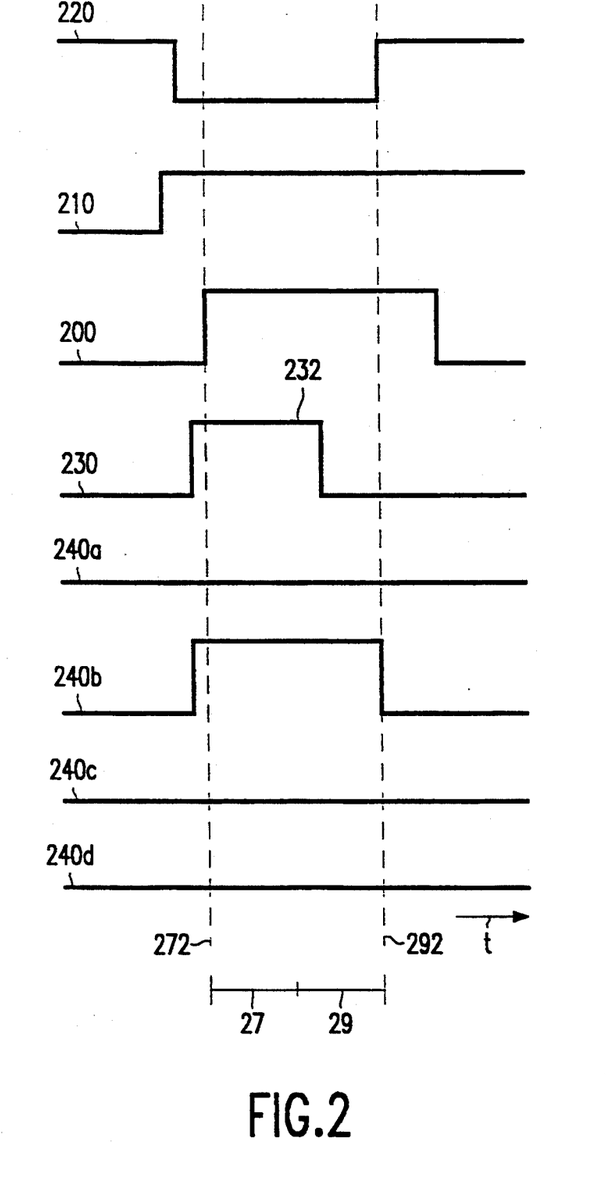
FIG. 2 shows signals used for writing into a ferroelectric memory.

FIG. 2 shows several voltage traces:
210 the write control signal on control line 487
200 the row select signal on row line 413a
220 the signal at the gate of the equalization switches 470a, 472a, 474a, 476a, 478a
230 the voltage on the common plateline 480,
240a,b,c,d voltages on the damlines 481, 482, 483, 484, In discussing FIG. 2, it will be assumed that one unit 410a has been selected by means of the addressing. After transition to their active state 202, 212, the row select signal will make switches 440a,b, 432a,b, 434a,b, 436a,b, 438a,b conductive. The column select signal (the inverse of the equalization signal 220) will make the switches 460a, 462a, 464a, 466a, 468a conductive. The switches 440c,d, 432c,d, 434c,d, 436c,d, 438c,d of the remaining units 410c,d are then non-conductive. The switches 460b, 462b, 464b, 466b, 468b are also non-conductive.

Writing is initiated by the write control signal 210. Writing is effected in a time period indicated by the vertical dashed lines 272, 292 which is composed of two intervals 27, 29. The first interval 27 is staged by the row select signal 200. The plateline signal 230 contains a pulse 234 which provides a high voltage on the plateline connection 412a during the first interval 27. The plateline signal 230 is returned to a low voltage during the second interval 29.

A logic high is written in a particular ferroelectric capacitor 426a in the unit 410a. The corresponding read/write circuit 486b ensures that the bitline voltage 240b is at the high value at least during the second interval 29. Thus, there will be a voltage difference across the plates of a selected capacitor 426b in the second interval 29, the capacitor plate on the bitline side being high and the plate on the plateline side being low. Any spurious pulsed voltage differences between the bitline side and the plateline side (due to timing differences between the start of the bitline and plateline signals) is avoided because the row select signal 200 starts later than the plateline signal 230 and the bitline signal 240b.

A logic low is written in the ferroelectric capacitors 424a, 428a, 430a. The corresponding read/write circuits 486a, 486c, 486d ensure that the bitline voltages 240a,c,d are at the low value during the first interval 27 and does not go to the high value in the second interval 29. Thus there will be a voltage difference across the plates of a selected capacitors 424a, 428a, 430a in the first interval 27 only, the plate on the bitline side being low and the plate on the plateline side being high.

The difference between writing a high logic level and a low logic level to individual capacitors 424a, 426a, 428a, 430a is controlled by the voltages 244a,b,c,d placed on the individual damlines 481, 482, 483, 484 by the read/write circuits 486a, 486b, 486c, 486d. A common plateline signal 230 is used for all capacitors 486a, 486b, 486c, 486d in the unit 410a.

After writing all bitlines 452a, 454a, 456a, 458a and the plate line 450a are returned zero voltage before the switches 432a, 434a, 436a, 438a, 440a are made non-conductive. This ensures that information is stored purely as a polarization of the ferroelectric material and not as a charge.

Figure 3:
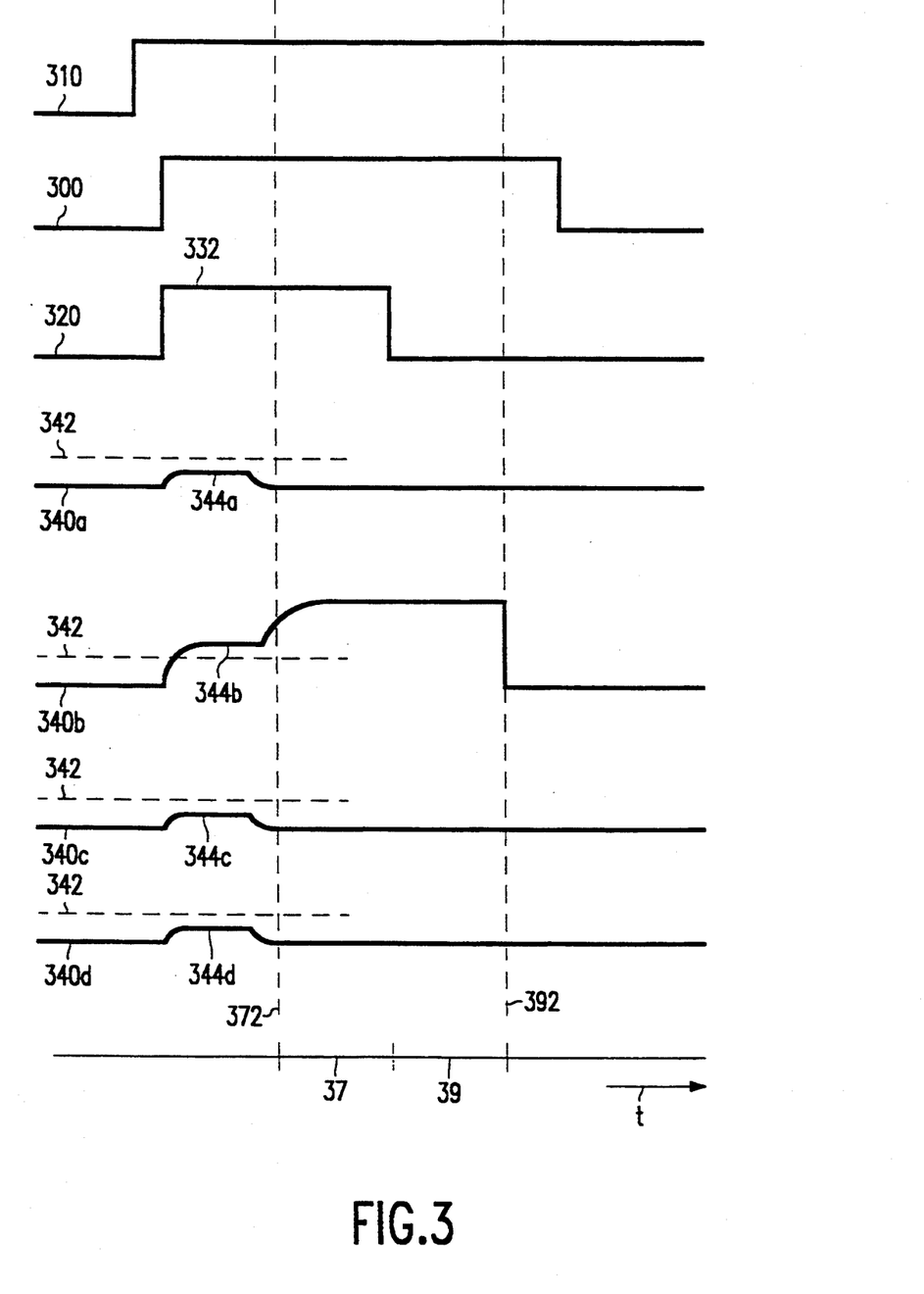
FIG. 3 shows signals used for reading from a ferroelectric memory.

FIG. 3 shows an example of signals used in a read operation. The example concerns the same memory unit 410a and the same data 0,1,0,0 as in FIG. 2. The various switches will therefore be in the positions as discussed for FIG. 2. FIG. 3 contains several voltage traces:

310 the read control signal on control line 488
300 the row select signal on row line 413a
320 the signal at the gate of the equalization switches 470a, 472a, 474a, 476a, 478a
330 the voltage on the common plateline 480,
340a,b,c,d voltages on the datalines 481, 482, 483, 484, Reading is initiated by the read control signal 310. Actual reading starts with a pulse 332 applied to the common plateline (and thereby to the plateline 450a of the selected unit 410a) at a time when the voltage 340a, 340b, 340c, 340d on the bitlines 452a, 454a, 456a, 458a is low. The pulse 332 on the plateline 450a will result in a voltage pulse across the plates of the capacitors 424a, 426a, 428a, 430a in the selected unit 410a.

The bits of information stored in the respective capacitors 424a, 426a, 428a, 430a can be measured after the start of the pulse as respective charges transferred to the capacitors via respective bitlines 452a, 454a, 456a, 458a and damlines 481, 482, 483,484 and the read/write amplifiers 486a, 486b, 486c, 486d. Assuming that the read/write amplifiers 486a, 486b, 486c, 486d represent capacitive loads for the datalines 481, 482, 483, 484 these charges result in residual voltages 344a,b,c,d on the datalines 481, 482, 483, 484. These voltages 344a,b,c,d are shown in traces 340a,b,c,d of FIG. 2. The voltages 344a,b,c,d are shown smaller than full scale to indicate that they are relatively small residual voltages. The traces are not drawn to scale.

The voltages 344a,b,c,d on the datalines 481, 482, 483, 484 will be relatively high or low with respect to a reference level 342, according to the amount of polarization originally stored on a respective ferroelectric capacitor 424a, 426a, 428a, 430a. In FIG. 2, by way of example these logic levels are 0,1,0,0 for the capacitors 424a, 426a, 428a, 430a respectively.

After the voltages 344a,b,c,d have started developing, the read/write circuits 486a, 486b, 486c, 486d are activated to amplify these signals. This causes the bitline voltage 340a,b,c,d to move to logic high 340b or low 340a,c,d depending on whether the bitline voltage was above or below the reference level 342. The information can then be read from the datalines and be supplied to the processing unit 40 via the data input/output 42.

After the voltages 344a,b,c,d have reached the logic level (to the right of the vertical dashed line 372) a write back operation is executed which lasts until the second vertical dashed line 392. Writeback occurs in two intervals 37, 39 and is analogous to a normal write operation as described using FIG. 2.

The procedure for reading and writing bits of information which described is one example of how reading an writing may be effected in a ferroelectric memory. Reference is had to U.S. Pat. No. 4,873,664 and its references for other ways of effecting reading and writing.

Also, the read and write control signals 210, 310 on read/write control lines 487, 488 have been used for explanation purposes. In practical use, control may involve other control lines, like chip enable, write enable and output enable. By means of signals on these lines, possibly in combination with the detection of address changes, the start of read and write will be triggered.

The plateline pulse 232, 332 as shown in FIGS. 2 and 3 is supplied only to the capacitors 424a, 426a, 428a, 430a, in the addressed unit 410a. The plateline pulse is not supplied to the capacitors in the other units 410b, 410c, 410d —because they are in a column which is disconnected from the common plate line 480 by the plateline switch 460b, —and/or because they are in an unselected row for which the first and second switches 432c, 432d, 434c, 434d, 436c, 436d, 438c, 438d, 440c, 440d are non-conductive.

Reading and writing is therefore limited to one memory unit at a time.

It has been found that a change in the voltage across the plates of a ferroelectric capacitor and a current through the ferroelectric capacitor can disturb the polarization state of the ferroelectric capacitor, even when this change in voltage or this current is small.

Because the plateline pulse is not supplied to the unselected units 410b, 410c, 410d via any conductive path, there will be substantially no pulse voltage on the plates of the unselected ferroelectric capacitors 424b, 424c, 424d, 426b, 426c, 426d, 428b, 428c, 428d, 430b, 430c, 430d. Consequently, there is no risk of a voltage developing across the plates of the unselected ferroelectric capacitors 424b, 424c, 424d, 426b, 426c, 426d, 428b, 428c, 428d, 430b, 430c, 430d. Disturbance of the polarization state of the capacitor is therefore avoided.

Under some circumstances, parasitic coupling from the common plate line 480 to the unselected plate lines 450b may occur even when the plateline switch 460b is not conductive. This may be due, for example, to capacitive coupling between the common plateline 480 and the unselected platelines 450b. Similarly, and independently, parasitic coupling may occur from the data lines 481, 482, 483, 484 to the unselected bit lines 452b, 454b, 456b, 458b.

Due to such parasitic couplings there may still be a residual pulse even on the unselected platelines 450b and/or the unselected bitlines 452b, 454b, 456b, 458b. Such a residual pulse may give rise to voltage pulses across the plates of the capacitors 424b, 426b, 428b, 430b in units 410b which are in unselected columns but in the row of the selected unit 410a.

As explained hereinbefore, these pulses are undesirable. The undesirable pulses may be prevented by providing equalizing switches 470a, 470b, 472a, 472b, 474a, 474b, 476a, 476b, 478a, 478b for all columns. In operation, the plateline 450b and the bitlines 452b, 454b, 456b, 458b of the unselected columns are connected to an equalizing potential, for example ground potential, to prevent the undesired pulses from developing. As an alternative the bitlines 452b, 454b, 456b, 458b of the unselected columns may be connected to the plateline 450b of the unselected column. This will also prevent pulses across the capacitors 424b, 426b, 428b, 430b of the unselected units 410b.

To prevent any undesired pulses from reaching the capacitors in the units 410a, 410b, 410c, 410d all bitlines 452a, 452b, 454a, 454b, 456a, 456b, 458a, 458b are preferably kept equalized with their corresponding platelines 450a, 450b when no access is desired. That is, the equalizing switches 470a, 470b, 472a, 472b, 474a, 474b, 476a, 476b, 478a, 478b are preferably kept conductive until a read write pulse needs to be supplied to the unit 410a, 410b, 410c, 410d via the plateline 450a, 450b.

During access, selection of the column should not change from one column to another. The same goes for selection of the rows. This may be achieved by using the access enable signal, for example, to latch the addresses in the row 498 and column selection circuit 490, in order to prevent such changes.

Even when there are no parasitic couplings, it is desirable that the equalizing switches 470a, 472a, 474a, 476a, 478a be made conductive, at least after a unit 410a is accessed. This is advantageous when, subsequently, a unit 410d in another column and row is accessed. Equalization in this case prevents any potential level due to charge remaining on the bitlines 452a, 454a, 456a, 458a of the column of the lately accessed unit influencing another unit from 410c in the newly selected row. Such equalization may be achieved, for example, by rendering all columns temporarily unselected after access to a memory unit.

From the figures and the description it will be clear that parasitic access pulses on ferroelectric capacitors may be generally prevented using memory units for the storage of multiple bits. For an N bit unit this is achieved using N first switches 432a,b,c,d, 434a,b,c,d, 436a,b,c,d, 438a,b,c,d and one second switch per unit 410a, 410b, 410c, 410d. For the purpose of illustration 4 bit units 410a, 410b, 410c, 410d have been shown, but the invention may of course be applied to units with any number of bits greater than one. Typical numbers are, for example, 8 bits, 16 bit or 32 bit words (or slightly larger words, for example, if additional parity bits are included in order to be able to detect and/or correct memory errors).

Furthermore, it is not necessary that the number of bits in the units correspond to the full word size of the processing units. An integer divisor of the full word size may also be used (e.g. for a 32 bit word size, one may use 32/4=8 or 32/2=16 bit units). Also, it is not necessary to transport the bits in parallel to the processor. Instead, for example, after being read in parallel from the memory unit, the bits may be transported to the processing unit 40 in series. The processing unit 40 and the memory 41 may be provided together in a single integrated circuit or they may be provided in separate integrated circuits on a circuit carrier like a printed circuit board.

Furthermore, the invention is not limited to systems with memory units with only one capacitor per bit. One may also use a pair of capacitors per bit. In this case each memory unit will contain a plurality of such pairs, with per unit a common switch connected to one plate of all capacitors in the unit and individual switches connected to the other plate of the capacitors in the unit.

As shown in the figures, the memory can be implemented using MOS transistor switches as the switching elements. Instead of MOS transistors, bipolar transistors may be used. The semiconductor used may be silicon, or some other, like GaAs. Without deviating from the invention, one may even selectively replace some of the MOS switches by two terminal non-linear devices, such as Zener diodes or MIM (metal insulator metal) elements. Such devices become conductive when a voltage placed across their terminals exceeds a threshold value. In a unit 410a, either the second switch 440a, or the first switches 432a, 434a, 436a, 438a (but not both) may be replaced by such non linear devices, which need not be connected to the row line 413a. In operation the switching element 440a or all of the switching element 432a, 434a, 436a, 438a, whichever has not been replaced by a two terminal non linear device, is made conductive by a signal via the row line. A sufficiently high potential difference provided between the plateline 450a and bitlines 452a, 454a, 456a, 458a during access will produce a voltage exceeding the threshold of the non linear device across the terminals of this device. The non linear device then becomes conductive, providing a charge transfer path to the capacitors 424a, 426a, 428a, 430a.

I claim:

1. A word oriented processing system, comprising: a processing unit interfaced to a ferroelectric memory organized in a matrix of rows and columns of identical memory units, each column comprising a respective plateline for conducting an access pulse, each memory unit comprising a series arrangement connected between a bitline connection and the plateline of the column to which the memory unit belongs, the series arrangement comprising, successively, the bit line connection, a first switching element, a ferroelectric capacitor and a second switching element, the memory comprising means for activating the first and second switching elements of memory units selected by the processor unit for establishing a charge transfer path through the memory unit, wherein each memory unit comprises a plurality of said series arrangements, which share the second switching element, and access means arranged for writing and/or reading respective information bits of a word as polarization of respective ferroelectric capacitors in respective series arrangements in a memory unit which is selected by the processing unit and for collectively transferring the information bits of said word in parallel between said memory unit and the processing unit.

2. A word oriented processing system according to claim 1, wherein the processing unit is coupled to an enable input and an address input of the access means for sending an access enable signal in combination with an address of an accessed column, the access means being arranged supply the access pulse on the plateline for the accessed column only upon reception of said access enable signal.

3. A word oriented processing system according to claim 2, each column comprising an identical set of bitlines connected on a one to one basis to the bitline connections of each memory unit in the column, each bitline being connected to a respective dataline switching element, the dataline switching elements in each column being coupled on a one to one basis to a set of data input/output lines common to all columns, the access means being arranged for collectively activating only the dataline switching elements of the accessed column during said access pulse.

4. A word oriented processing system according to claim 2, which comprises equalizing means under control of the access means, arranged for mutually equalizing the voltage levels of the respective plateline and the bitlines in each respective column other than the accessed column during said access pulse.

5. A word oriented processing system according to claim 4, wherein the equalizing means in each column comprise equalizing switching elements, coupled between on one hand a reference voltage node and on the other hand the plateline and the bitlines respectively, the access means being arranged for activating the equalizing switching elements in a column when the dataline switching elements in that column are deactivated.

6. A word oriented processing system according to claim 4, wherein the equalizing means are arranged for mutually equalizing the voltage levels of the respective plateline and the plurality of bitlines in all respective columns between successive access pulses, prior to activations of the first and second switching elements of the memory units in a row.

7. A ferroelectric memory device suitable for use in a word oriented processing system according to claim 1, the memory device comprising the memory units and the access means.

8. A ferroelectric memory device suitable for use in a word oriented processing system according to claim 4, the memory device comprising the memory units, the access means and the equalizing means.

9. A word oriented processing system comprising:
a processing unit arranged for word oriented processing of information words each comprising a number of bits, and
a ferroelectric memory comprising:
a plurality of memory units, organized in a matrix of rows and columns,
each column of the ferroelectric memory comprising a respective plateline for conduction of an access pulse,
wherein each memory unit includes a plurality of bitline connections, a plurality of first switching elements, a plurality of ferroelectric capacitors, and a second switching element, each memory unit comprising a number of respective serial arrangements connected between respective bitline connections and a respective plateline, each said serial arrangement comprising a respective first switching element, a respective ferroelectric capacitor and said second switching element,
means for activating the first and second switching elements of memory units selected by the processing unit for establishing a capacitor charge transfer path through the memory unit, said activating means including respective row lines for collectively activating the second switching elements of the memory units of their respective rows of memory units, and
access means arranged for writing and/or reading respective information bits of a word as polarization of respective ferroelectric capacitors in respective series arrangements in a memory unit selected by the processing unit and for collectively transferring the information bits of said word in parallel between a memory unit and the processing unit.

10. The word oriented processing system as claimed in claim 9 further comprising:
a plurality of bitlines connected to respective bitline connections in respective memory units of respective memory unit columns,
a plurality of data input/output lines equal to the number of ferroelectric capacitors in a memory unit and coupled to said processing unit, and
a plurality of third switching units for coupling said data input/output lines to respective ones of said bitlines.

11. The word oriented processing system as claimed in claim 9, wherein the processing unit is coupled to an enable input and an address input of the access means for supplying an access enable signal in combination with an address of a particular column, the access means being arranged to supply an access pulse on the plateline of the particular column only upon reception of said access enable signal.

12. The word oriented processing system as claimed in claim 11 further comprising:
a plurality of bitlines connected to respective bitline connections in respective memory units, and
means for coupling said plurality of bitlines to a plurality of data input/output lines common to all columns via respective pluralities of dataline switching elements, the access means being arranged to collectively activate only the plurality of dataline switching elements of an accessed column during said access pulse.

13. The word oriented processing system as claimed in claim 9 further comprising:
a plurality of bitlines connected to respective bitline connections in respective memory units, and
equalizing means under control of the access means, arranged for mutually equalizing voltage levels of the respective plateline and the plurality of bitlines in each respective column other than a particular column accessed during said access pulse.

14. The word oriented processing system as claimed in claim 13 wherein the equalizing means are arranged to mutually equalize the voltage levels of the respective plateline and the plurality of bitlines in all respective columns between successive access pulses and prior to activation of the first and second switching elements of the memory units in a row.

15. The word oriented processing system as claimed in claim 9 wherein the number of ferroelectric capacitors in each memory unit is equal to the number of bits in an information word.

16. The word oriented processing system as claimed in claim 15 further comprising:
a common plateline selectively coupled to said processing unit and further coupled to said platelines via respective third switching units controlled by a column selection circuit, said column selection circuit being controlled by said processing unit.

17. The word oriented processing system as claimed in claim 9 further comprising:
a plurality of bitlines connected to respective bitline connections in the memory units,
a plurality of data lines coupled to said processing unit,
a plurality of data line switching elements for coupling respective data lines to respective bitlines, the access means being arranged for collectively activating only the data line switching elements of the accessed column during said access pulse, and equalizing means under control of the access means and arranged for mutually equalizing voltage levels of the respective plateline and the plurality of bitlines in each respective column other than a particular column accessed during said access pulse, wherein the equalizing means in each column comprise equalizing switching elements coupled between a reference voltage node and the plateline and respective ones of the plurality of bitlines, the access means being arranged to activate the equalizing switching elements only when the data line switching elements are deactivated.

18. The word oriented processing system as claimed in claim 9 wherein the second switching unit of each memory unit is common to all of the serial arrangements of such memory unit, and the number of ferroelectric capacitors in each memory unit is equal to the number of bits in an information word, and wherein said row lines and platelines extend at right angles to one another.

19. The word oriented processing system as claimed in claim 9 wherein said ferroelectric memory further comprises:
- a row selection circuit coupled to said processing unit and to the first and second switching elements of the memory units, and
- a column selection circuit coupled to said processing unit and to further switching units coupled in turn between respective platelines and a further common plateline.

20. The word oriented processing system according to claim 3 which further comprises:
- equalizing means under control of the access means and arranged for mutually equalizing the voltage levels of the respective plateline and the bitlines in each respective column other than the access column during said access pulse, and wherein
- the equalizing means in each column comprise equalizing switching elements coupled between a reference voltage node and the plateline and the bitlines respectively, the access means being arranged to activate the equalizing switching elements in a column when the data line switching elements in that column are deactivated.

* * * * *